(12) United States Patent
Chen et al.

(10) Patent No.: US 11,270,911 B2
(45) Date of Patent: Mar. 8, 2022

(54) DOPING OF METAL BARRIER LAYERS

(71) Applicant: Applied Materials, Inc., Santa Clara, CA (US)

(72) Inventors: Lu Chen, Cupertino, CA (US); Christina L. Engler, Union City, CA (US); Gang Shen, San Jose, CA (US); Feng Chen, San Jose, CA (US); Tae Hong Ha, San Jose, CA (US); Xianmin Tang, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 30 days.

(21) Appl. No.: 16/867,990

(22) Filed: May 6, 2020

(65) Prior Publication Data

US 2021/0351072 A1    Nov. 11, 2021

(51) Int. Cl.
*H01L 21/768* (2006.01)
(52) U.S. Cl.
CPC .. *H01L 21/76858* (2013.01); *H01L 21/76846* (2013.01); *H01L 21/76862* (2013.01); *H01L 21/76864* (2013.01); *H01L 21/76877* (2013.01)

(58) Field of Classification Search
None
See application file for complete search history.

(56) References Cited

U.S. PATENT DOCUMENTS

| | | | |
|---|---|---|---|
| 4,914,059 A * | 4/1990 | Nissim | H01L 21/02271 438/590 |
| 5,976,928 A | 11/1999 | Kirlin et al. | |
| 6,294,836 B1 | 9/2001 | Paranjpe et al. | |
| 6,365,502 B1 | 4/2002 | Paranjpe et al. | |
| 6,436,825 B1 | 8/2002 | Shue | |
| 7,157,795 B1 | 1/2007 | Erb et al. | |
| 7,808,106 B1 | 10/2010 | Eisenbraun | |
| 8,013,445 B2 | 9/2011 | Lee et al. | |
| 8,841,769 B2 | 9/2014 | Park et al. | |
| 9,659,814 B2 | 5/2017 | Lakshmanan et al. | |

(Continued)

FOREIGN PATENT DOCUMENTS

| | | |
|---|---|---|
| CN | 101558476 A | 10/2009 |
| CN | 108063117 A | 5/2018 |

(Continued)

OTHER PUBLICATIONS

PCT International Preliminary Report on Patentability in PCT/US2012/067212, dated Jun. 12, 2014, 8 page.

(Continued)

*Primary Examiner* — Xiaoming Liu
(74) *Attorney, Agent, or Firm* — Servilla Whitney LLC

(57) ABSTRACT

Described are methods for doping barrier layers such as tantalum (Ta), tantalum nitride (TaN), tantalum carbide (TaC), niobium (Nb), niobium nitride (NbN), manganese (Mn), manganese nitride (MnN), titanium (Ti), titanium nitride (TiN), molybdenum (Mo), and molybdenum nitride (MoN), and the like. Dopants may include one or more of one or more of ruthenium (Ru), manganese (Mn), niobium (Nb), cobalt (Co), vanadium (V), copper (Cu), aluminum (Al), carbon (C), oxygen (O), silicon (Si), molybdenum (Mo), and the like. The doped barrier layer provides improved adhesion at a thickness of less than about 15 Å.

20 Claims, 4 Drawing Sheets

(56) References Cited

U.S. PATENT DOCUMENTS

| | | |
|---|---|---|
| 10,008,412 B2 | 6/2018 | Lakshmanan et al. |
| 10,431,493 B2 | 10/2019 | Lakshmanan et al. |
| 10,784,157 B2 | 9/2020 | Lakshmanan et al. |
| 2002/0137332 A1 | 9/2002 | Paranjpe |
| 2004/0188850 A1 | 9/2004 | Lee et al. |
| 2005/0070109 A1 | 3/2005 | Feller et al. |
| 2005/0161817 A1 | 7/2005 | Meyer et al. |
| 2006/0027932 A1 | 2/2006 | Yu et al. |
| 2006/0063375 A1 | 3/2006 | Sun et al. |
| 2006/0267205 A1 | 11/2006 | Koerner |
| 2008/0142971 A1 | 6/2008 | Dordi et al. |
| 2008/0179747 A1 | 7/2008 | Sakai et al. |
| 2009/0152722 A1 | 6/2009 | Chang et al. |
| 2009/0209101 A1* | 8/2009 | Shinriki ............. C23C 16/32 438/686 |
| 2009/0218693 A1 | 9/2009 | Lee |
| 2009/0297696 A1 | 12/2009 | Pore et al. |
| 2010/0009530 A1 | 1/2010 | Haneda et al. |
| 2010/0013096 A1 | 1/2010 | Irumata |
| 2010/0081274 A1 | 4/2010 | Ishizaka et al. |
| 2010/0200991 A1 | 8/2010 | Akolkar et al. |
| 2011/0306203 A1 | 12/2011 | Dordi et al. |
| 2013/0081687 A1 | 4/2013 | Wu et al. |
| 2013/0140698 A1* | 6/2013 | Lakshmanan ..... H01L 21/76862 257/751 |
| 2013/0221445 A1 | 8/2013 | Yu et al. |
| 2014/0024212 A1 | 1/2014 | Ryan et al. |
| 2017/0141159 A1 | 5/2017 | Kim |
| 2018/0250695 A1 | 9/2018 | Choi et al. |
| 2019/0148223 A1 | 5/2019 | Chou et al. |
| 2019/0185993 A1 | 6/2019 | Chen et al. |
| 2019/0378754 A1 | 12/2019 | Lakshmanan et al. |
| 2019/0385908 A1 | 12/2019 | Xie et al. |
| 2020/0043858 A1 | 2/2020 | Wu et al. |

FOREIGN PATENT DOCUMENTS

| | | |
|---|---|---|
| KR | 20060089219 | 8/2006 |
| KR | 20090094369 A | 9/2009 |
| KR | 20110014586 A | 2/2011 |
| TW | 201027625 A | 7/2010 |
| WO | 2013082370 A1 | 6/2013 |

OTHER PUBLICATIONS

PCT International Search Report and Written Opinion in PCT/US2012/067212, dated Mar. 26, 2013, 12 pages.

Casey, P., et al., "Chemical and structural investigation of the role of both Mn and Mn oxide in the formation of manganese silicate barrier layers on SiO2", Journal of Applied Physics 110, 2011, 6 pgs.

Non-Final Office Action in U.S. Appl. No. 16/909,148, dated Aug. 5, 2021, 10 pages.

PCT International Search Report and Written Opinion in PCT/US2021/030126 dated Aug. 25, 2021, 11 pages.

PCT International Search Report and Written Opinion in PCT/US2021/030783 dated Aug. 20, 2021, 9 pages.

* cited by examiner

DOPING OF METAL BARRIER LAYERS

TECHNICAL FIELD

Embodiments of the disclosure generally relate to methods of treating and/or doping barrier layers. More particularly, embodiments of the disclosure are directed to methods of treating and doping ALD metal barrier films with ruthenium.

BACKGROUND

Microelectronic devices, such as semiconductors or integrated circuits, can include millions of electronic circuit devices such as transistors, capacitors, etc. To further increase the density of devices found on integrated circuits, even smaller feature sizes are desired. To achieve these smaller feature sizes, the size of conductive lines, vias, and interconnects, gates, etc. must be reduced. Reliable formation of multilevel interconnect structures is also necessary to increase circuit density and quality. Advances in fabrication techniques have enabled use of copper for conductive lines, interconnects, vias, and other structures. However, electromigration in interconnect structures becomes a greater hurdle to overcome, with decreased feature size and the increased use of copper for interconnections. Such electromigration may adversely affect the electrical properties of various components of the integrated circuit.

Specifically, for 5 nm node and below, barrier and liner thickness for copper interconnects becomes even more challenging with respect to device reliability and adhesion of the barrier layer. Also, the baseline thickness of a barrier film and liner at 5 nm is ~45 Å. Higher thicknesses provide less space for gapfill and can increase resistivity.

Tantalum nitride (TaN) is a copper barrier at film thicknesses greater than 10 Å, where the film is continuous. However, at nodes below 22 nm, TaN deposited by thermal atomic layer deposition (thermal ALD) is not a good copper barrier layer. Therefore, there is a need for new methods for depositing films that are effective copper barriers.

SUMMARY

Embodiments of the disclosure provide methods of forming doped barrier layer. In one or more embodiments, the method comprises: forming a first barrier film on the substrate by atomic layer deposition; doping the first barrier film with a dopant metal by exposing the first barrier film to a metal precursor during a flash chemical vapor deposition process; and forming a second barrier film on the doped first barrier film by atomic layer deposition to form a doped barrier layer.

Additional embodiments of the disclosure are directed to methods of forming a doped metal nitride layer. In one or more embodiments, the method comprises: exposing a substrate to a first metal precursor and ammonia to form a first metal nitride film on the substrate, the substrate comprising a dielectric layer having at least one feature; doping the first barrier film with a dopant metal by exposing the first metal nitride film to a dopant metal precursor during a flash chemical vapor deposition process; and exposing the substrate to the first metal precursor and ammonia to form a second metal nitride film on the doped first metal nitride film to form a doped metal nitride layer.

Further embodiments of the disclosure are directed to a non-transitory computer readable medium including instructions, that, when executed by a controller of a processing system, causes the processing system to perform operations of: form a first barrier film on the substrate; dope the first barrier film with a dopant metal to form a doped first barrier film; and form a second barrier film on the doped first barrier film to form a doped barrier layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
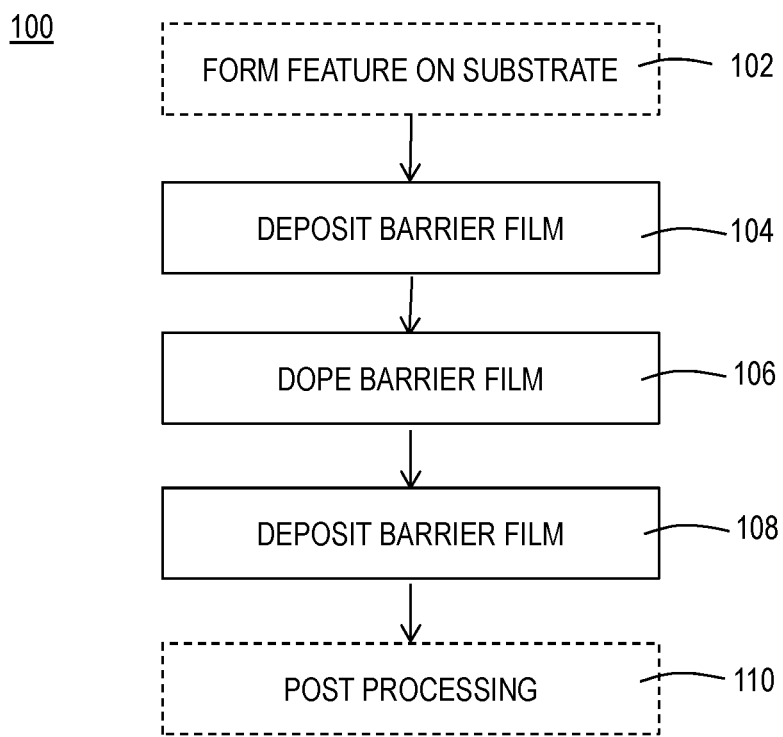
FIG. 1 illustrates a process flow diagram in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

It has advantageously been found that the adhesion of the barrier layer can be improved by doping the barrier layer with one or more of ruthenium (Ru), manganese (Mn), niobium (Nb), cobalt (Co), vanadium (V), copper (Cu), aluminum (Al), carbon (C), oxygen (O), silicon (Si), molybdenum (Mo), and the like.

In one or more embodiments, the barrier layer may be deposited via ALD. In a typical ALD process, alternating pulses or flows of "A" precursor and "B" precursor can be used to deposit a film. The alternating exposure of the surface to reactants "A" and "B" is continued until the desired thickness film is reached. However, instead of pulsing the reactants, the gases can flow simultaneously from one or more gas delivery head or nozzle and the substrate and/or gas delivery head can be moved such that the substrate is sequentially exposed to each of the reactive gases. Of course, the aforementioned ALD cycles are merely exemplary of a wide variety of ALD process cycles in which a deposited layer is formed by alternating layers of precursors and co-reactants.

In one or more embodiments, the co-reactants are in vapor or gas form. The reactants may be delivered with a carrier gas. A carrier gas, a purge gas, a deposition gas, or other process gas may contain nitrogen, hydrogen, argon, neon, helium, or combinations thereof. The various plasmas described herein, such as the nitrogen plasma or the inert gas plasma, may be ignited from and/or contain a plasma co-reactant gas.

In one or more embodiments, the various gases for the process may be pulsed into an inlet, through a gas channel, from various holes or outlets, and into a central channel. In one or more embodiments, the deposition gases may be sequentially pulsed to and through a showerhead. Alternatively, as described above, the gases can flow simultaneously through gas supply nozzle or head and the substrate and/or the gas supply head can be moved so that the substrate is sequentially exposed to the gases.

In one or more embodiments, the barrier layer material and the dopant metal are deposited using a multi-chamber process with separation of the barrier layer material (e.g. tantalum nitride (TaN)) and the dopant metal. In other embodiments, a single chamber approach is used, with all processes occurring within one chamber and the different layers separated in processing by gas purges.

Some embodiments of the invention are directed to barrier applications, e.g. copper barrier applications. The barrier layer formed by one or more embodiments may be used as a copper barrier. Suitable barrier films for copper barrier applications include, but are not limited to, TaN and MnN. For copper barrier applications, suitable dopants include, but are not limited to, Ru, Cu, Co, Mn, Al, Ta, Mo, Nb, V, or combinations thereof. A plasma treatment can be used after doping to promote the intermetallic compound formation between the matrix and dopant, as well as removing film impurities and improving the density of the barrier layer. In other embodiments, post treatment can include, but is not limited to, physical vapor deposition (PVD) treatment, thermal anneal, chemical enhancement, or the like. In some copper barrier applications, a high frequency plasma (defined as greater than about 14 MHz or about 40 MHz or greater) can be used with any inert gas, including, but not limited to, one or more of neon (Ne), hydrogen ($H_2$), and argon (Ar) gas. In one or more embodiments, to prevent low-k damage, a higher plasma frequency can be used (higher than 13.56 MHz). In some embodiments, the barrier film is a copper barrier and comprises TaN doped with Ru.

Suitable precursors for depositing a barrier film include metal-containing precursors and nitrogen-containing precursors. For example, if the barrier film is tantalum nitride (TaN), the tantalum-containing precursor may be pentakis (dimethylamino)tantalum (PDMAT) and the nitrogen-containing precursor may be ammonia. If the barrier film is manganese nitride (MnN), the manganese-containing precursor may be bis]bis(trimethylsilyl)amido]manganese(II) ($Mn(TMSA)_2$). Other suitable precursors are known to those skilled in the art. Organic species in organic-containing precursors for barrier films may get partially incorporated into the underlying layer (such as a dielectric layer), which may increase the adhesion at the barrier layer-underlying layer interface.

In one or more embodiments, the dopant metal may be incorporated into the barrier layer by any suitable method known to the skilled artisan. For example, in one or more embodiments, the dopant metal may be incorporated into the barrier layer by one or more of alternating and/or co-flowing of precursors in atomic layer deposition (ALD), chemical vapor deposition (CVD), and plasma enhanced atomic layer deposition (PEALD); precursors with multi-metal ligands; and dopant implanting/thermal diffusion. In one or more embodiments, when the dopant metal is incorporated into the barrier layer by alternating and/or co-flowing of precursors in atomic layer deposition (ALD), chemical vapor deposition (CVD), and plasma enhanced atomic layer deposition (PEALD), an appropriate metal-containing precursor may be used. Examples of suitable precursors include metal complexes containing the desired dopant, such as dopant metals coordinated with organic or carbonyl ligands. In one or more embodiments, a dopant precursor may comprise a multi-metal ligand. A suitable dopant precursor should have sufficient vapor pressure to be deposited in the appropriate process, such as ALD, plasma enhance atomic layer deposition (PEALD), or chemical vapor deposition (CVD). In one or more embodiments, the dopant is deposited using a chemical vapor deposition (CVD) process.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

Depending on the dopant precursor used, a co-reactant may be used to deposit the dopant. For example, reducing gases such as hydrogen and ammonia can be used as co-reactants for depositing some dopants. Metal dopant precursors and co-reactants may be either co-flowed or flowed sequentially.

In one or more embodiments, ion implantation may be used for incorporating the dopant metal into the barrier layer. In other embodiments, physical vapor deposition (PVD) co-treatment may be used to add a second metal dopant, e.g. cobalt (Co), into the doped barrier layer. In further embodiments, the barrier film may be annealed inside an atmosphere comprising the dopant metal to thermally diffuse the dopant into the film.

In one or more embodiments, PVD treatment with dopant sputtering can be used as a way to incorporate the dopant into the matrix. For example, PVD treatment with cobalt (Co) can inject Co into a ruthenium tantalum nitride (RuTaN) matrix to form RuTaN\Co compound. This can be used to add the first dopant or an additional dopant other than the one inside the film.

In one or more embodiments, the dopant is not limited to a metal. In one or more embodiments, a non-metal can also be a dopant, for example, silicon (Si), boron (B), or the like. Non-metal dopants may also be used for thermal diffusion.

In some embodiments, instead of or in addition to using a reducing gas co-reactant, a post-plasma treatment step may be used after exposing the barrier film to the dopant metal precursor. According to one or more embodiments, the plasma comprises any suitable inert gas known to the skilled artisan. In one or more embodiments, the plasma comprises one or more of helium (He), argon (Ar), ammonia ($NH_3$), hydrogen ($H_2$), and nitrogen ($N_2$). In some embodiments, the plasma may comprise a mixture of Ar and $H_2$, such as a mixture having an Ar:$H_2$ molar ratio in the range from 1:1 to 1:10. The plasma power may be in the range from about 200 to about 1000 Watts. The plasma frequency may be in the range from 350 kHz to 40 MHz. The plasma treatment time may vary from 5 second to 60 seconds, such as in the range from 10 seconds to 30 seconds. In some embodiments, the pressure during plasma treatment may be in the range from 0.5 to 50 Torr, such as from 1 to 10 Torr. In some embodiments, the wafer spacing may be in the range from 100 mils to 600 mils.

In one or more embodiments, the barrier film may be exposed to the dopant metal precursor during deposition, i.e. the dopant metal precursor may be used sequentially in the ALD cycle to provide a doped barrier film. For example, 1-10 cycles of metal-containing precursors and nitrogen-containing precursors can be used to form an initial metal nitride barrier layer, followed by exposure to 1-10 cycles of the dopant metal precursor, then resuming cycles of the metal-containing precursors and nitrogen-containing precursors, then optionally more doping, etc., until the desired doped barrier film thickness is reached. Alternatively, in other embodiments, the barrier film may be completely deposited to the desired thickness before exposing to the dopant metal precursors.

In various embodiments, the duration of the exposure to the dopant metal-containing precursor may range from 1 to 60 seconds, such as in the range from 3 to 30 seconds or from 5 to 10 seconds. Longer exposures to the dopant metal precursor will increase the amount of doping of the barrier film, as long as the barrier film has not reached the maximum doping for the density of the barrier film.

Figure 2:
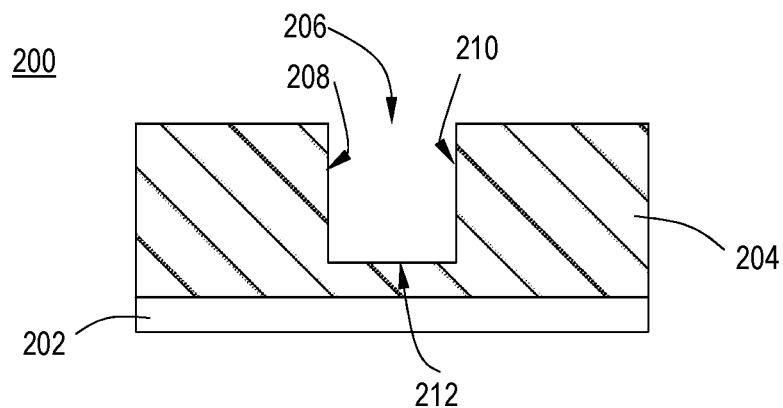
FIG. 2 illustrates a cross sectional view of an electronic device in accordance with one or more embodiments of the disclosure.

FIG. 1 depicts a process flow diagram of a method according to one or more embodiments. FIGS. 2 through 4 illustrate cross sectional views of a microelectronic device 200 in accordance with one or more embodiments of the disclosure. Referring to FIG. 2, a dielectric layer 204 is formed on a substrate 202. In one or more embodiments, the dielectric layer 204 may comprise at least one feature 206. The Figures show substrates having a single feature for illustrative purposes; however, those skilled in the art will understand that there can be more than one feature. The shape of the feature 206 can be any suitable shape including, but not limited to, trenches and cylindrical vias. As used in this regard, the term "feature" means any intentional surface irregularity. Suitable examples of features include, but are not limited to trenches which have a top, two sidewalls and a bottom, peaks which have a top and two sidewalls.

Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

In one or more embodiments, the at least one feature 206 comprises a bottom 212 and a first sidewall 208 and a second sidewall 210.

In one or more embodiments, the dielectric layer 204 is a low-k dielectric layer. In certain embodiments, the dielectric layer 204 comprises silicon oxide ($SiO_x$). Further embodiments provide that the dielectric layer 204 comprises porous or carbon-doped $SiO_x$. In some embodiments, the dielectric layer 204 is a porous or carbon-doped $SiO_x$ layer with a k value less than about 5. In other embodiments, the dielectric layer 204 is a multilayer structure. For example, in one or more embodiments, the dielectric layer 204 comprises a multilayer structure having one or more of a dielectric layer, an etch stop layer, and a hard mask layer.

With reference to FIGS. 1 through 3A, at operation 104 a barrier film 214 is deposited on a dielectric layer 204 on a substrate 202. In some embodiments, the barrier film 214 is formed by a conformal deposition process. In some embodiments, the barrier film 214 is formed by one or more of atomic layer deposition or chemical vapor deposition.

In one or more embodiments, the deposition of the barrier film 214 is substantially conformal. In one or more embodiments, the barrier film 214 forms on the first sidewall 208, the second sidewall 210, and the bottom 212 of the at least one feature. As used herein, a layer which is "substantially conformal" refers to a layer where the thickness is about the same throughout (e.g., on the top, middle and bottom of sidewalls and on the bottom of the opening 206). A layer which is substantially conformal varies in thickness by less than or equal to about 5%, 2%, 1% or 0.5%.

Figure 3A:
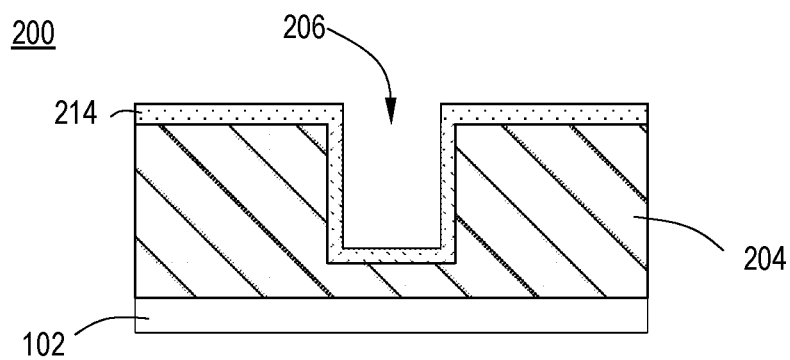
FIG. 3A illustrates a cross sectional view of an electronic device in accordance with one or more embodiments of the disclosure.
Figure 3B:
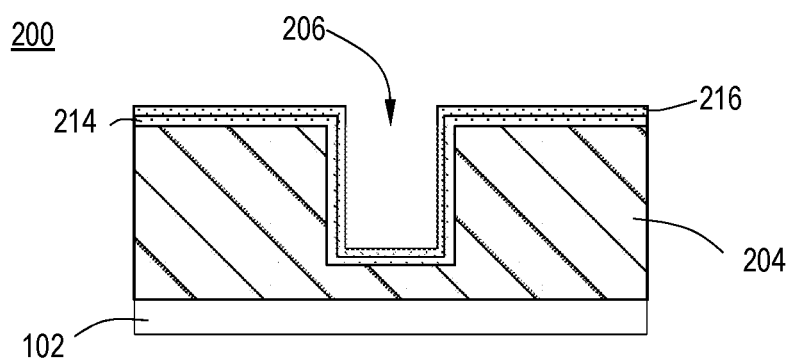
FIG. 3B illustrates a cross sectional view of an electronic device in accordance with one or more embodiments of the disclosure.
Figure 4:
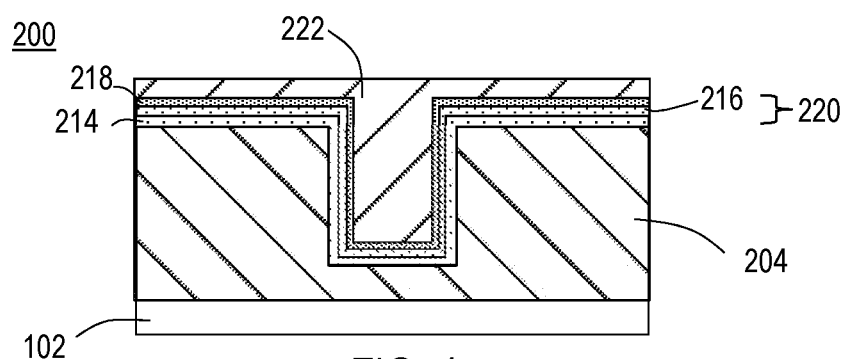
FIG. 4 illustrates a cross sectional view of an electronic device in accordance with one or more embodiments of the disclosure.

FIG. 3A shows the microelectronic device 200 after deposition of a barrier film 214, which covers at least a portion of the first sidewall 208, the second sidewall 210 and the bottom 212 of the at least one feature 206. As illustrated in FIG. 3B, the barrier layer 214 may cover the entirety of the first sidewall 208, the second sidewall 210 and the bottom 212 of the at least one feature 206. In one or more embodiments, the barrier film 214 can comprise one or more of tantalum (Ta), tantalum nitride (TaN), tantalum carbide (TaC), niobium (Nb), niobium nitride (NbN), manganese (Mn), manganese nitride (MnN), titanium (Ti), titanium nitride (TiN), molybdenum (Mo), molybdenum nitride (MoN), and the like.

In one or more embodiments, the barrier film 214 is deposited by atomic layer deposition (ALD), and has a thickness in a range of from about 2 Å to about 10 Å. In some embodiments, the barrier film 214 is deposited in a single ALD cycle. In other embodiments, the barrier film 214 is deposited in from 1 to 15 ALD cycles.

With reference to FIG. 1 and FIG. 3B, at operation 106, the barrier film 214 is doped by depositing chemical vapor deposition of a doped barrier film 216. In one or more embodiments, the barrier films may be doped with one or more of ruthenium (Ru), manganese (Mn), niobium (Nb), cobalt (Co), vanadium (V), copper (Cu), aluminum (Al), carbon (C), oxygen (O), silicon (Si), molybdenum (Mo), and the like. In specific embodiments, the barrier films may be doped with ruthenium (Ru). Thus, in one or more embodiments, the doped barrier film 216 comprises one or more of ruthenium (Ru), manganese (Mn), niobium (Nb), cobalt (Co), vanadium (V), copper (Cu), aluminum (Al), carbon (C), oxygen (O), silicon (Si), and the like.

In one or more embodiments, the metal dopant is diffuses through the barrier fill 214 to the dielectric layer 204. Without intending to be bound by theory, it is thought that the metal dopant can selectively diffuse through the barrier layer 214 to the dielectric layer and form a complex with the dielectric material that will be resistant to electromigration. One proposed mechanism is that the exposed precursor can preferentially migrate to the dielectric/barrier interface via grain boundaries or other weak paths.

In one or more embodiments, the complex formed may be a metal oxide ($MO_x$) or a metal silicate ($MSi_xO$). Thus, in embodiments where the dopant is ruthenium (Ru) and the dielectric layer comprises silicon oxide ($SiO_x$), the ruthenium (Ru) can diffuse through the barrier layer 214 and form ruthenium oxide ($RuO_x$) or ruthenium silicon oxide ($RuSiO_x$). This barrier layer of ruthenium silicon oxide can then prevent copper electromigration from the conductive material 222 to the dielectric layer 204.

In other embodiments, the metal dopant may form intermetallic compounds with the barrier layer matrix, resulting in a high density, low resistivity phase, which presents superior barrier performance to copper (Cu), oxygen (O), carbon (C), and the like, for example $Ta_xRu_yN$ or $Ta_xRu_yN_zO$.

In addition to being a conductive material 222 barrier, doped barrier layer 220 may also be a barrier to oxygen diffusing from the dielectric layer 204 to the conductive material 222. Oxygen diffusion from the dielectric layer 204 to the conductive material 222 can result in oxygen reacting with component in the conductive material 222 and/or seed layer (not illustrated). For example, if the conductive material comprises copper (Cu), then oxygen can react with the copper at the interface of the barrier layer and the conductive material 222, thus pinning the copper to the barrier layer/ conductive material interface. As a result, the copper cannot segregate throughout the conductive material. Similarly, if a seed layer comprising copper is present, then oxygen can react with the copper in the seed layer at the seed layer/ barrier layer interface and pin the copper to the interface.

In one or more embodiments, it is thought that oxygen diffusing into the barrier layer will react with the dopant and will prevent oxygen from diffusing into the conductive material 222. As a result, oxygen will not be available to react with the seed layer or the conductive material 222.

In one or more embodiments, the doped barrier film 216 is deposited by chemical vapor deposition and has a thickness in a range of from about 1 Å to about 3 Å.

In one or more embodiments, the doped barrier film 216 comprises in a range of from about 0.01 to about 50 wt. % dopant, based on the total weight of the barrier film. In certain embodiments, the doped barrier film 216 comprises a range of from about 5% to about 70% dopant, such as a range of from about 10 to about 30 wt. % dopant, such as a range of from about 8 to about 25 wt. % dopant, or a range of from about 10 to about 20 wt. % dopant. In some embodiments, the barrier film 214 comprises a range of from about 5 to about 30 wt. % dopant, such as about 5 wt. %, about 6 wt. %, about 7 wt. %, about 8 wt. %, about 9 wt. %, about 10 wt. %, about 11 wt. %, about 12 wt. %, about 13 wt. %, about 14 wt. %, 15 wt. %, about 16 wt. %, about 17 wt. %, about 18 wt. %, about 19 wt. %, about 20 wt. %, about 21 wt. %, about 22 wt. %, about 23 wt. %, about 24 wt. %, 25 wt. %, about 26 wt. %, about 27 wt. %, about 28 wt. %, about 29 wt. %, or about 30 wt. % dopant.

Figure 3C:
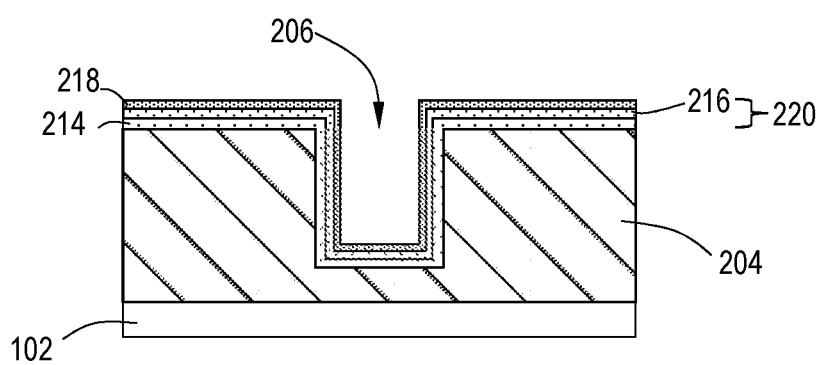
FIG. 3C illustrates a cross sectional view of an electronic device in accordance with one or more embodiments of the disclosure.

With reference to FIG. 1 and FIG. 3C, at operation 108, a second barrier film 218 is deposited on the doped barrier film 216. In one or more embodiments, the second barrier film 218 comprises the same material as the barrier film 214. In one or more embodiments, the second barrier film 218 can comprise one or more of tantalum (Ta), tantalum nitride (TaN), tantalum carbide (TaC), niobium (Nb), niobium nitride (NbN), manganese (Mn), manganese nitride (MnN), titanium (Ti), titanium nitride (TiN), molybdenum (Mo), molybdenum nitride (MoN), and the like.

In one or more embodiments, the second barrier film 218 is deposited by atomic layer deposition (ALD), and has a thickness in a range of from about 2 Å to about 6 Å. In some embodiments, the second barrier film 218 is deposited in a single ALD cycle. In other embodiments, the second barrier film 218 is deposited in from 1 to 15 ALD cycles.

In one or more embodiments, the doped barrier layer 220, which comprise the barrier film 216, doped barrier film 216, and second barrier film 218, has a combined thickness in a range of from about 5 Å to about 15 Å, or from about 8 Å to about 10 Å. In further embodiments, the combined thickness is less than about 15 Å.

In one or more embodiments, the doped barrier layer 220 has a high metal content and an amorphous crystallinity. Without intending to be bound by theory, it is thought that doping a barrier layer reduces the ALD crystallinity of the deposited barrier layer, which could reduce diffusion shortcut on grain boundary. Doping within the barrier layer instead of on top of the barrier may mitigate integration and corrosion risks due to minimal dopant diffusion.

In one or more embodiments, the doped barrier layer 220 comprises a dopant metal in a barrier film, where the dopant metal is an amorphous matrix of nanocrystallites. In specific embodiments, the doped tantalum nitride (TaN) barrier film comprises a ruthenium (Ru) in a tantalum nitride film, where the ruthenium (Ru) is an amorphous matrix of nanocrystallites The doped barrier film of one or more embodiments shows better diffusion barrier properties than a barrier film that is not doped. Additionally, the doped barrier film of one or more embodiments, demonstrates superior adhesion to copper and oxide.

At operation 110, the device is optionally post-processing. The optional post-processing operation 110 can be, for example, a process to modify film properties (e.g., annealing) or a further film deposition process (e.g., additional ALD or CVD processes) to grow additional films. In some embodiments, the optional post-processing operation 110 can be a process that modifies a property of the deposited film. In some embodiments, the optional post-processing operation 110 comprises annealing the as-deposited film. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the film is annealed for a predetermined time in the range of about 15 seconds to about 90 minutes, or in the range of about 1 minute to about 60 minutes. In some embodiments, annealing the as-deposited film increases the density, decreases the resistivity and/or increases the purity of the film.

With reference to FIG. 4, a conductive fill material 222 fills at least a portion of the trench 206 lined with barrier film 214, doped barrier film 216, and second barrier film 218. According to one or more embodiments, the conductive fill material 222 comprises copper (Cu) or a copper alloy. In further embodiments, the conductive fill material 222 also comprises manganese (Mn). In other embodiments, the conductive fill material 222 further comprises aluminum (Al). In some embodiment, the conductive fill material 222 comprises tungsten (W).

Although the conductive fill material 220 in FIG. 4 is shown in direct contact with the barrier layer 220, intermediate layers may be in between the conductive fill material 222 and the barrier layer 220, such as adhesion layers or seeding layers. For example, in one or more embodiments, the microelectronic device 200 further comprises an adhesion layer comprising one or more of Ru and Co. In addition to Ru and/or Co, the adhesion layer may comprise one or more dopants such as Mn, Al, Mg, Cr, Nb, Ti or V. In some embodiments, the adhesion layer comprises Ru and Mn. In other embodiments, the adhesion layer comprises Co and Mn.

In certain embodiments, a seeding layer (not illustrated) may be deposited on top of the doped barrier layer 220. According to one or more embodiments, the seeding layer can comprise an alloy of copper, such as a Cu—Mn alloy.

In addition to being a copper barrier, the doped barrier layer 220 may also be a barrier to oxygen diffusing from the dielectric layer 204 to the conductive fill material 222. Oxygen diffusion from the dielectric layer 204 to the conductive fill material 222 can result in oxygen reacting with components in the conductive fill material 222 and/or seed layer.

In some embodiments, the substrate is moved from a first chamber to a separate, next chamber for further processing. The substrate can be moved directly from the first chamber to the separate processing chamber, or the substrate can be moved from the first chamber to one or more transfer chambers, and then moved to the separate processing chamber. In some embodiments, the deposition of the barrier film and the dopant film can be done in a single chamber, and then the post-processing can be performed in a separate chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Figure 5:
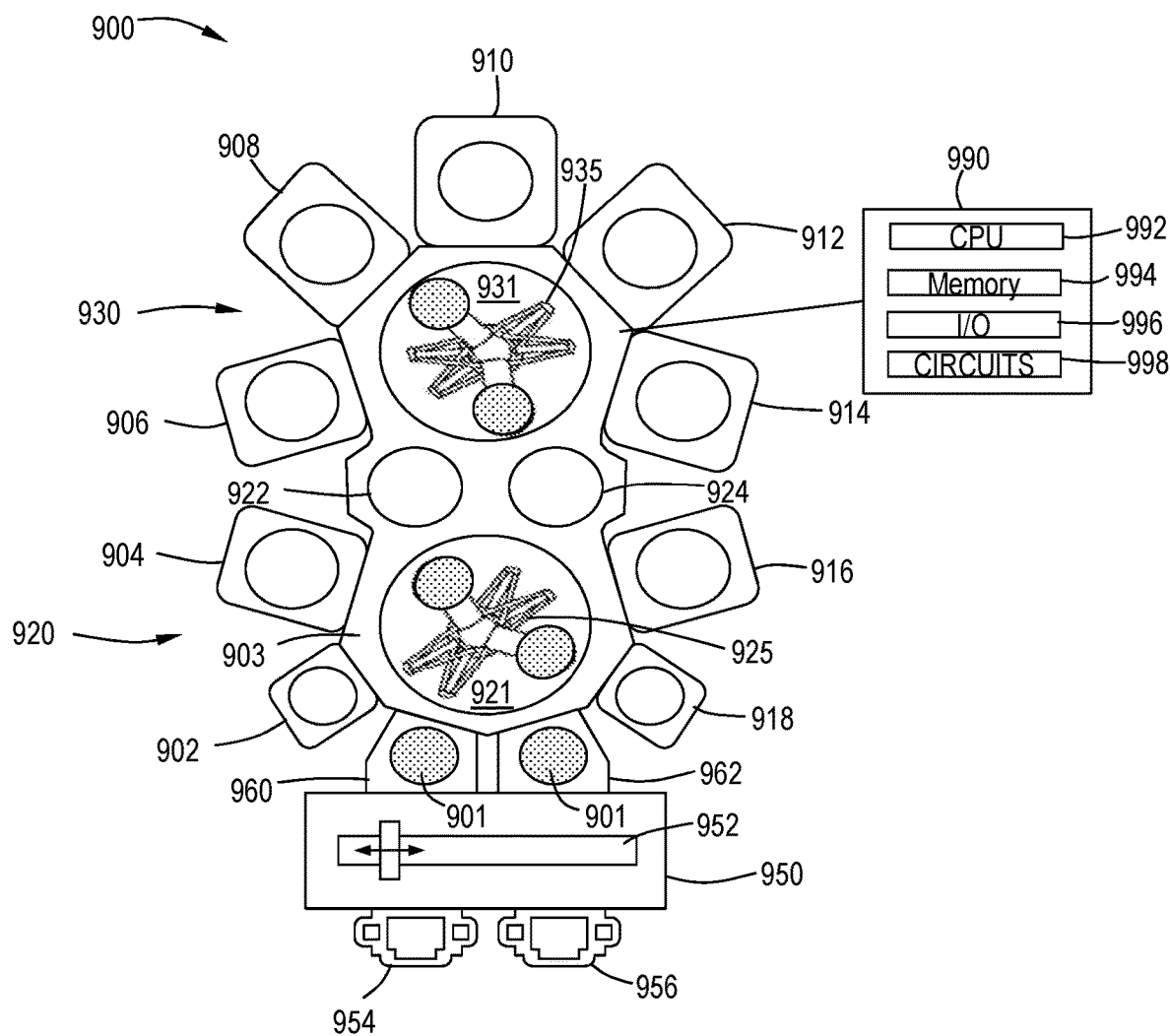
FIG. 5 illustrates a cross-sectional view of a cluster tool in accordance with one or more embodiment of the disclosure.

Additional embodiments of the disclosure are directed to processing tools 900 for the formation of the devices and practice of the methods described, as shown in FIG. 5. The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, an atomic layer deposition chamber, a chemical vapor deposition chamber, an annealing chamber, and the like. The particular arrangement of process chambers and components can be varied depending on the cluster tool and should not be taken as limiting the scope of the disclosure.

In the embodiment shown in FIG. 5, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In some embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit (CPU) 992, memory 994, inputs/outputs (I/O) 996, and support circuits 998. The controller 990 may control the processing tool 900 directly, or via computers (or controllers) associated with particular process chamber and/or support system components.

In one or more embodiments, the controller 990 may be one of any form of general-purpose computer processor that can be used in an industrial setting for controlling various chambers and sub-processors. The memory 994 or computer readable medium of the controller 990 may be one or more of readily available memory such as non-transitory memory (e.g. random access memory (RAM)), read only memory (ROM), floppy disk, hard disk, optical storage media (e.g., compact disc or digital video disc), flash drive, or any other form of digital storage, local or remote. The memory 994 can retain an instruction set that is operable by the processor (CPU 992) to control parameters and components of the processing tool 900.

The support circuits 998 are coupled to the CPU 992 for supporting the processor in a conventional manner. These circuits include cache, power supplies, clock circuits, input/output circuitry and subsystems, and the like. One or more processes may be stored in the memory 994 as software routine that, when executed or invoked by the processor, causes the processor to control the operation of the processing tool 900 or individual processing units in the manner described herein. The software routine may also be stored and/or executed by a second CPU (not shown) that is remotely located from the hardware being controlled by the CPU 992.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 990 has one or more configurations to execute individual processes or sub-processes to perform the method. The controller 990 can be connected to and configured to operate intermediate components to perform the functions of the methods. For example, the controller 990 can be connected to and configured to control a physical vapor deposition chamber.

Processes may generally be stored in the memory 994 of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the system controller 990 has a configuration to control an atomic layer deposition chamber to deposition a barrier film on a substrate. The system controlled 990 has a second configuration to control a chemical vapor deposition chamber to deposit a metal film on the barrier film at a temperature in the range of about 20° C. to about 400° C.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising a deposition chamber, a plasma treatment chamber, a remote plasma source, an annealing chamber, and a controller connected to the central transfer station and the plurality of process stations, the controller configured to activate the robot to move the wafer between process stations, and to control a process occurring in each of the process stations.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Example 1. Ruthenium Doping of Tantalum Nitride (TaN): Single Layer

About 3-4 Å of TaN was deposited via nine ALD cycles using PDMAT and ammonia precursors at 250-275° C. The TaN was doped with Ru by flash CVD, resulting in about 1 Å to about 2 Å of Ru having a nanocrystallite structure. Another 3-4 Å of TaN was deposited via nine ALD cycles using PDMAT and ammonia precursors at 250-275° C. The thickness of the final Ru-doped TaN barrier layer was about 8 Å to 10 Å.

Example 2. Ruthenium Doping of Tantalum Nitride (TaN): Single Layer

7 Å of TaN was deposited via twelve ALD cycles using PDMAT and ammonia precursors at 250-275° C. The TaN was doped with Ru by flash CVD, resulting in about 1 Å to about 2 Å of Ru having a nanocrystallite structure. Another 3 Å of TaN was deposited via five ALD cycles using PDMAT and ammonia precursors at 250-275° C. The thickness of the final Ru-doped TaN barrier layer was about 11 Å to 12 Å.

Example 3. Ruthenium Doping of Tantalum Nitride (TaN): Multiple Layers

4 Å of TaN was deposited via ALD using PDMAT and ammonia precursors at 250-275° C. The TaN was doped with Ru by flash CVD, resulting in about 1 Å of Ru having a nanocrystallite structure. Another 4 Å of TaN was deposited via ALD using PDMAT and ammonia precursors at 250-275° C. Another film of doped Ru was deposited by flash CVD, resulting in about 1 Å of Ru having a nanocrystallite structure. Another 3 Å of TaN was deposited via ALD using PDMAT and ammonia precursors at 250-275° C. The thickness of the final Ru-doped TaN barrier layer was about 13 Å.

Example 4. Ruthenium Doping of Tantalum Nitride (TaN): Multiple Layers

3 Å of TaN was deposited via ALD using PDMAT and ammonia precursors at 250-275° C. The TaN was doped with Ru by flash CVD, resulting in about 1 Å of Ru having a nanocrystallite structure. Another 2 Å of TaN was deposited via ALD using PDMAT and ammonia precursors at 250-275° C. Another film of doped Ru was deposited by flash CVD, resulting in about 1 Å of Ru having a nanocrystallite structure. Another 3 Å of TaN was deposited via ALD using PDMAT and ammonia precursors at 250-275° C. Another film of doped Ru was deposited by flash CVD, resulting in about 1 Å of Ru having a nanocrystallite structure. Another 2 Å of TaN was deposited via ALD using PDMAT and ammonia precursors at 250-275° C. The thickness of the final Ru-doped TaN barrier layer was about 12 Å.

Example 5. Ruthenium Doping of Tantalum Nitride (TaN): Intermediate Post-Treatment after Ru Dope About 5-7 Å of TaN was deposited via ALD using PDMAT and ammonia precursors at 250-275° C. The TaN was doped with Ru by flash CVD, resulting in about 1 Å of Ru having a nanocrystallite structure, followed by 10 second exposure to hydrogen ($H_2$) plasma. Another 3-5 Å of TaN was deposited via ALD using PDMAT and ammonia precursors at 250-275° C. The thickness of the final Ru-doped TaN barrier layer was about 9 Å to about 13 Å.

Example 6. Ruthenium Doping of Tantalum Nitride (TaN): Intermediate Post-Treatment after Ru Dope About 4 Å of TaN was deposited via ALD using PDMAT and ammonia precursors at 250-275° C. The TaN was doped with Ru by flash CVD, resulting in about 1 Å of Ru having a nanocrystallite structure, followed by 10 second exposure to hydrogen ($H_2$) plasma. Another 4 Å of TaN was deposited via ALD using PDMAT and ammonia precursors at 250-275° C. Another film of doped Ru was deposited by flash CVD, resulting in about 1 Å of Ru having a nanocrystallite structure, followed by 10 second exposure to hydrogen ($H_2$) plasma. Another 3 Å of TaN was deposited via ALD using PDMAT and ammonia precursors at 250-275° C. The thickness of the final Ru-doped TaN barrier layer was about 13 Å.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method for forming a doped barrier layer, the method comprising:
    forming a first barrier film on a dielectric layer on a substrate by atomic layer deposition, the first barrier film having a thickness in a range of from 2 Å to 10 Å;
    doping the first barrier film with a dopant metal by exposing the first barrier film to a metal precursor during a flash chemical vapor deposition process to form a doped first barrier film having a thickness in a range of from 1 Å to 3 Å and comprising from 10 wt. % to 30 wt. % dopant metal, wherein the dopant metal diffuses through the first barrier film to the dielectric layer and forms a complex with the dielectric layer; and
    forming a second barrier film having a thickness in a range of from 2 Å to 6 Å on the doped first barrier film by atomic layer deposition to form a doped barrier layer, the doped barrier layer having a combined thickness in a range of from 5 Å to 15 Å.

2. The method of claim 1, wherein the first barrier film and the second barrier film independently comprise one or more of tantalum (Ta), tantalum nitride (TaN), tantalum carbide (TaC), niobium (Nb), niobium nitride (NbN), manganese (Mn), manganese nitride (MnN), titanium (Ti), titanium nitride (TiN), molybdenum (Mo), and molybdenum nitride (MoN), and the like.

3. The method of claim 1, wherein the dopant metal comprises one or more of one or more of ruthenium (Ru), manganese (Mn), niobium (Nb), cobalt (Co), vanadium (V), copper (Cu), aluminum (Al), carbon (C), oxygen (O), silicon (Si), molybdenum (Mo) and the like.

4. The method of claim 1, wherein the first barrier film and the second barrier film comprise tantalum nitride (TaN), and the dopant metal comprises ruthenium (Ru).

5. The method of claim 4, wherein the dopant metal forms an intermetallic compound with the first barrier film and the second barrier film, the intermetallic compound having a formula of $Ta_xRu_yN$ or $Ta_xRu_yN_xO$.

6. The method of claim 1, further comprising exposing the doped barrier layer to one or more of plasma treatment, physical vapor deposition (PVD) treatment, thermal anneal, and chemical enhancement after doping.

7. The method of claim 1, wherein the substrate comprises at least one feature.

8. The method of claim 6, wherein the at least one feature has an aspect ratio greater than or equal to about 10:1.

9. The method of claim 1, wherein one or more of the first barrier film or the second barrier film are deposited at a temperature in a range of from 250° C. to 275° C.

10. A method of forming a doped metal nitride layer, the method comprising:
    exposing a substrate to a first metal precursor and ammonia to form a first metal nitride film on the substrate, the substrate comprising a dielectric layer having at least one feature, the first metal nitride film having a thickness in a range of from 2 Å to 10 Å;
    doping the first metal nitride film with a dopant metal by exposing the first metal nitride film to a dopant metal precursor during a flash chemical vapor deposition process to form a doped first metal nitride film having a thickness in a range of from 1 Å to 3 Å and comprising from 10 wt. % to 30 wt. % dopant metal, wherein the dopant metal diffuses through the first metal nitride film to the dielectric layer and forms a complex with the dielectric layer; and
    exposing the substrate to the first metal precursor and ammonia to form a second metal nitride film on the doped first metal nitride film to form a doped metal nitride layer, the doped metal nitride layer having a combined thickness in a range of from 5 Å to 15 Å.

11. The method of claim 10, wherein the first metal nitride film and the second metal nitride film independently comprise one or more of tantalum nitride (TaN), niobium nitride (NbN), manganese nitride (MnN), titanium nitride (TiN), molybdenum (Mo), and molybdenum nitride (MoN).

12. The method of claim 10, wherein the dopant metal comprises one or more of one or more of ruthenium (Ru), manganese (Mn), niobium (Nb), cobalt (Co), vanadium (V), copper (Cu), aluminum (Al), carbon (C), oxygen (O), silicon (Si), molybdenum (Mo), and the like.

13. The method of claim 10, further comprising exposing the doped metal nitride layer to one or more of plasma treatment, physical vapor deposition (PVD) treatment, thermal anneal, and chemical enhancement after doping.

14. The method of claim 10, wherein the at least one feature comprises a first sidewall, a second sidewall, and a bottom, and the first metal nitride film is substantially conformal.

15. The method of claim 14, wherein the at least one feature has an aspect ratio greater than or equal to about 10:1.

16. The method of claim 10, wherein the dopant metal forms an intermetallic compound with the first metal nitride film and the second metal nitride film, the intermetallic compound having a formula of $Ta_xRu_yN$ or $Ta_xRu_yN_xO$.

17. The method of claim 10, wherein one or more of the first metal nitride film or the second metal nitride film are deposited at a temperature in a range of from 250° C. to 275° C.

18. A non-transitory computer readable medium including instructions, that, when executed by a controller of a processing system, causes the processing system to perform operations of:
    form a first barrier film on a dielectric layer on a substrate, the first barrier film having a thickness in a range of from 2 Å to 10 Å;
    dope the first barrier film with a dopant metal to form a doped first barrier film having a thickness in a range of from 1 Å to 3 Å and comprising from 10 wt. % to 30 wt. % dopant metal, wherein the dopant metal diffuses through the first barrier film to the dielectric layer and forms a complex with the dielectric layer; and
    form a second barrier film on the doped first barrier film to form a doped barrier layer, the doped barrier layer having a combined thickness in a range of from 5 Å to 15 Å.

19. The non-transitory computer readable medium of claim 18, further comprising instruction that, when executed by a controller of a processing system, causes the processing system to perform operations of: expose the doped barrier layer to one or more of plasma treatment, physical vapor deposition (PVD) treatment, thermal anneal, and chemical enhancement after doping.

20. The method of claim 18, wherein one or more of the first barrier film or the second barrier film are deposited at a temperature in a range of from 250° C. to 275° C.

* * * * *